(12) United States Patent
Merry et al.

(10) Patent No.: US 9,698,074 B2
(45) Date of Patent: Jul. 4, 2017

(54) HEATED SUBSTRATE SUPPORT WITH TEMPERATURE PROFILE CONTROL

(71) Applicant: APPLIED MATERIALS, INC., Santa Clara, CA (US)

(72) Inventors: Nir Merry, Mountain View, CA (US); Leon Volfovski, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 248 days.

(21) Appl. No.: 14/481,283

(22) Filed: Sep. 9, 2014

(65) Prior Publication Data

US 2015/0076135 A1   Mar. 19, 2015

Related U.S. Application Data

(60) Provisional application No. 61/878,370, filed on Sep. 16, 2013.

(51) Int. Cl.
| | | |
|---|---|---|
| *H05B 3/68* | (2006.01) | |
| *H01L 23/34* | (2006.01) | |
| *H01L 21/683* | (2006.01) | |
| *H05B 3/28* | (2006.01) | |
| *H01L 21/67* | (2006.01) | |
| *H01L 21/687* | (2006.01) | |

(52) U.S. Cl.
CPC ........ *H01L 23/34* (2013.01); *H01L 21/67103* (2013.01); *H01L 21/67248* (2013.01); *H01L 21/683* (2013.01); *H01L 21/68792* (2013.01); *H05B 3/283* (2013.01); *H01L 2924/0002* (2013.01); *Y10T 29/49083* (2015.01)

(58) Field of Classification Search
CPC ......... H01L 2924/0002; H01L 2924/00; H01L 21/67103; H01L 21/67248; H01L 21/683; H01L 21/68792; H01L 23/34; H05B 3/283; Y10T 29/49083
USPC .......................................... 219/443.1–468.2
See application file for complete search history.

(56) References Cited

U.S. PATENT DOCUMENTS

| | | | | |
|---|---|---|---|---|
| 5,688,331 A | * | 11/1997 | Aruga | ............... C23C 16/45521 118/725 |
| 6,956,186 B1 | * | 10/2005 | Ito | ...................... G05D 23/1917 118/724 |
| 7,126,092 B2 | * | 10/2006 | Lin | ................... H01L 21/67109 118/728 |

(Continued)

FOREIGN PATENT DOCUMENTS

EP          2 568 062 A1     3/2013

OTHER PUBLICATIONS

International Search Report and Written Opinion mailed Dec. 23, 2014 for PCT Application No. PCT/US2014/054945.

*Primary Examiner* — Sang Y Paik
(74) *Attorney, Agent, or Firm* — Moser Taboada; Alan Taboada

(57) ABSTRACT

Methods and apparatus of substrate supports having temperature profile control are provided herein. In some embodiments, a substrate support includes: a plate having a substrate receiving surface and an opposite bottom surface; and a shaft having a first end comprising a shaft heater and a second end, wherein the first end is coupled to the bottom surface. Methods of making a substrate support having temperature profile control are also provided.

19 Claims, 3 Drawing Sheets

(56) References Cited

U.S. PATENT DOCUMENTS

| | | | |
|---|---|---|---|
| 7,683,295 B2 * | 3/2010 | Kimura | H01L 21/67103 219/444.1 |
| 7,851,728 B2 | 12/2010 | Futakuchiya et al. | |
| 8,274,017 B2 | 9/2012 | Yap et al. | |
| 2006/0151465 A1 | 7/2006 | Lin et al. | |
| 2011/0062144 A1 * | 3/2011 | Akatsuka | H05B 3/143 219/532 |
| 2012/0211484 A1 | 8/2012 | Zhou et al. | |
| 2013/0256966 A1 | 10/2013 | Volfovski et al. | |

* cited by examiner

HEATED SUBSTRATE SUPPORT WITH TEMPERATURE PROFILE CONTROL

CROSS-REFERENCE TO RELATED APPLICATIONS

This application claims benefit of U.S. provisional patent application Ser. No. 61/878,370, filed Sep. 16, 2013, which is herein incorporated by reference in its entirety.

FIELD

Embodiments of the present invention generally relate to semiconductor processing equipment.

BACKGROUND

In semiconductor substrate processing, the temperature of the substrate is often a critical process parameter. Changes in temperature, and temperature gradients across the substrate surface during processing are often detrimental to material deposition, etch rate, feature taper angles, step coverage, and the like. It is often desirable to have control over a substrate temperature profile before, during, and after substrate processing to enhance processing and minimize undesirable characteristics and/or defects.

The substrate is often supported upon a substrate support or pedestal having a centrally located support shaft to support the substrate support. The substrate support often includes one or more embedded heaters adapted to heat a substrate disposed thereon. However, the inventors have observed that conventional heated substrate supports with embedded heaters often display a temperature non-uniformity at the central region of the substrate support resulting in non-uniform of process results in the substrate. The inventors have observed that, in some cases, the temperature non-uniformity of the substrate support can be attributed to the support shaft drawing heat away from the substrate support.

Therefore, the inventors have provided embodiments of a heated substrate support having improved temperature uniformity.

SUMMARY

Methods and apparatus of substrate supports having temperature profile control are provided herein. In some embodiments, a substrate support includes: a plate having a substrate receiving surface and an opposite bottom surface; and a shaft having a first end comprising a shaft heater and a second end, wherein the first end is coupled to the bottom surface.

In some embodiments, a substrate support includes: a plate having a substrate receiving surface and an opposite bottom surface; a plate heater disposed in the plate; a plate temperature sensor disposed in the plate, wherein the plate heater and the plate temperature sensor are coupled to a controller; a shaft having a first end comprising a shaft heater and a second end, wherein the first end is coupled to the bottom surface; and a shaft temperature sensor disposed at the first end wherein the shaft temperature sensor and the shaft heater are coupled to a controller.

In some embodiments, a method of making a substrate support is provided and includes: forming a plate having a substrate receiving surface and an opposite bottom surface; forming a first layer of ceramic material, the first layer comprising a first end and an opposite second end; disposing a heater on the first layer at the first end; disposing a conduit on the first layer such that one end of the conduit is coupled to the heater and a second end of the conduit extends beyond the second end of the ceramic material; forming a second layer of ceramic material atop the first layer such the second layer at least partially covers the heater; processing the first layer and the second layer to form a shaft; and coupling the first end to the bottom surface of the plate.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
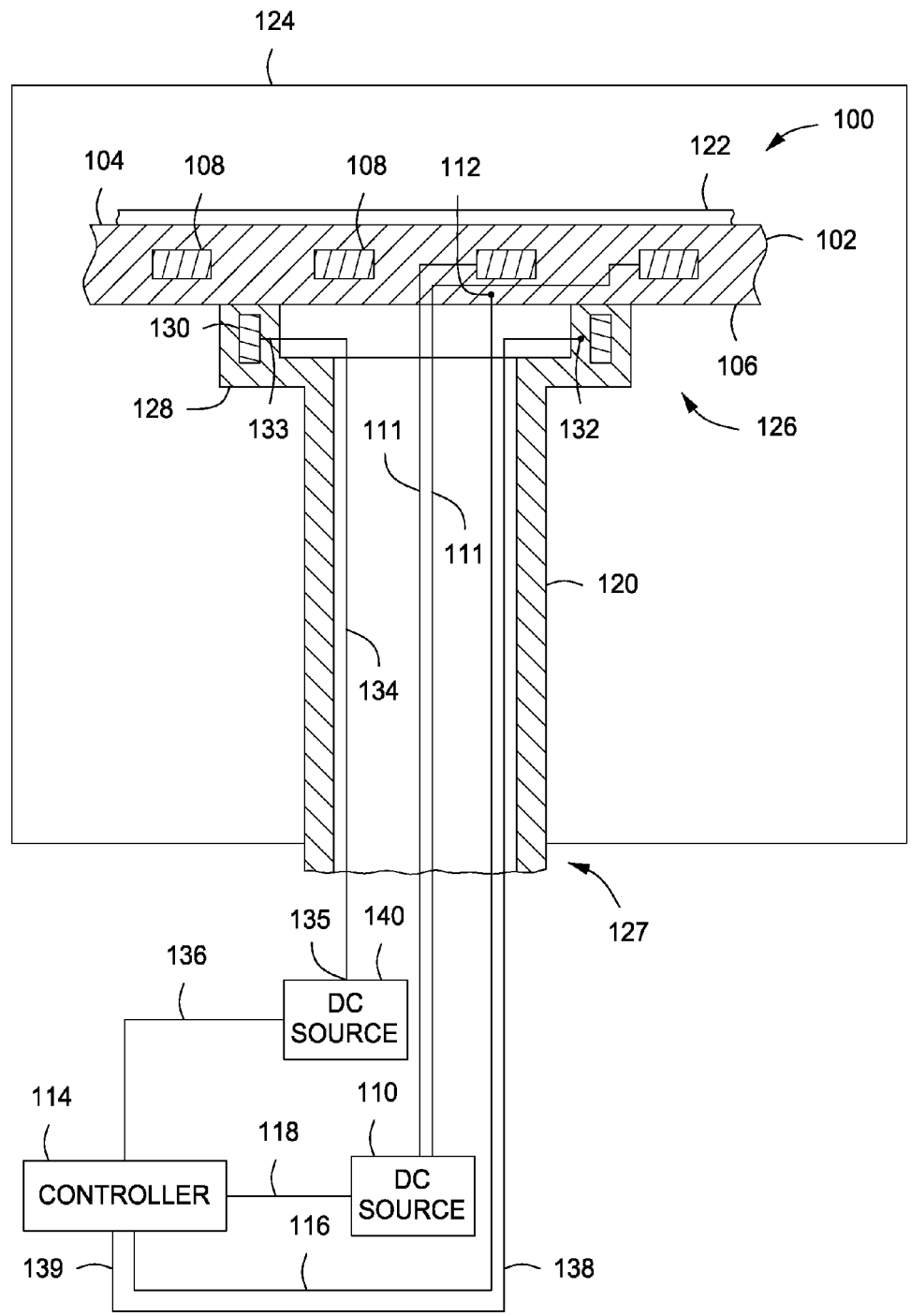
FIG. 1 depicts a schematic side sectional view of a substrate support in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide heated substrate supports having improved temperature uniformity control. Embodiments of the present invention may be used to support and heat a substrate for any process using a heated substrate support with enhanced control over a temperature profile created on the substrate. Non-limiting examples of processes that may benefit from the discloses substrate support include chemical vapor deposition (CVD), atomic layer deposition (ALD), or laser annealing processes.

FIG. 1 is a schematic side sectional view of a substrate support 100 in accordance with some embodiments of the present invention. The substrate support 100 comprises a heater plate, plate 102 comprising a substrate receiving surface 104 and a bottom surface 106. The plate 102 may be formed from one or more process compatible materials including ceramic materials such as silicon nitride ($Si_3N_4$), alumina ($Al_2O_3$), aluminum nitride (AlN), or silicon carbide (SiC) and metallic materials such as aluminum and stainless steel (SST) or alloys like silicon-aluminum alloys (Si—Al).

Embedded or disposed within the plate 102 are one or more plate heaters 108 (two plate heaters 108 shown). The plate heaters 108 may be in the form of rings, as illustrated. Alternately, the plate heaters 108 may be separate heater elements embedded within the plate 102. The plate heaters 108 are coupled to a power supply such as DC source 110 via conductors 111 to provide power to the plate heaters 108 to facilitate heating of the plate 102.

A plate temperature sensor 112, such as a resistive temperature device (RTD), is embedded in or coupled to the plate 102 to sense a temperature at an area of interest in the plate 102. The plate temperature sensor 112 is coupled to the controller 114 via conductor 116 to provide data regarding the plate 102 temperature to the controller 114.

The DC source 110 is also coupled to the controller 114 via conductor 118. The controller 114 regulates the amount of power provided to the plate heaters 108 based on the temperature data from the plate temperature sensor 112 to provide a preselected plate temperature. As such, the plate heaters 108, the DC source 110, the plate temperature sensor 112, and the controller 114 are linked and operate as a first closed loop control circuit to maintain a preselected temperature of the plate 102.

The controller 114 may be any general purpose computer adapted to read and monitor the temperature of the plate 102 from the data provided by the plate temperature sensor 112 and to regulate the amount of power provided to the plate heaters 108.

The plate 102 may rest on, and be supported by, a first end 126 of a shaft 120. The shaft 120 may be formed from process compatible materials as discussed above.

The first end 126 is mounted to the bottom surface 106 to support the plate 102, and a substrate 122 when disposed on the substrate receiving surface 104, in a position within a chamber 124 for example, for substrate processing or transfer. In some embodiments, the shaft 120 may provide one or more of vertical positioning and rotational positioning of the plate 102 and substrate 122 within the chamber 124 by a suitable lift actuator, a rotational actuator, or a combination lift and rotation actuator coupled to the shaft 120 (not shown).

In some embodiments, the first end 126 comprises a flange 128 to facilitate mounting of the shaft 120 to the bottom surface 106. The flange 128 may be mounted to the bottom surface 106 using any suitable mechanical fasteners, adhesives, welding, brazing, or the like. The flange 128 may be an integral component of the shaft 120 or a separate component coupled to the shaft 120, for example, by welding. In some embodiments, the first end 126 of the shaft 120 may be mounted to the bottom surface 106 without a flange. For example, adhesives, welding, brazing, or the like may be used to mount the first end 126 of the shaft 120 to the bottom surface 106. The shaft 120 may be directly coupled to the bottom surface 106 to minimize thermal resistance between the shaft 120 and the bottom surface 106 of the plate 102.

At least one shaft heater 130 is coupled to the flange 128. In some embodiments, the at least one shaft heater 130 is at least partially embedded in the flange 128. In some embodiments, the at least one shaft heater 130 is a resistive heater. A first end 133 of conductor 134 is coupled to the shaft heater 130. A second end 135 of conductor 134 extends beyond the second end 127 of the shaft 120 and is coupled to a power supply, such as DC source 140, to facilitate providing power to the at least one shaft heater 130 to heat the first end 126 of the shaft 120.

A shaft temperature sensor 132, such as a resistive temperature device, is also embedded in or coupled to the flange 128. A first end 137 of conductor 138 is coupled to the shaft temperature sensor 132. A second end 139 of the conductor 138 extends beyond the second end 127 of the shaft 120 and is coupled to a controller, for example controller 114. The DC source 140 may also be coupled to the controller 114, for example via conductor 136. A control circuit similar to the first closed loop control circuit described above comprises the shaft heater 130, the DC source 140, the shaft temperature sensor 132, and the controller 114 linked to operate as a second closed loop control circuit. In the second closed loop circuit, the controller 114 regulates the power to the shaft heater 130 in response to temperature data provided by the shaft temperature sensor 132 to facilitate temperature control of the first end 126 of the shaft 120. The first closed loop circuit and the second closed loop circuit may have a common controller 114 as shown, or the closed loop circuits may have separate controllers that may be in communication with each other.

In some embodiments, the first closed loop control circuit (the plate heaters 108, the DC source 110, the plate temperature sensor 112, and the controller 114) and the second closed loop circuit (the shaft heater 130, the DC source 140, the shaft temperature sensor 132, and the controller 114) are linked together, for example through the controller 114. The controller 114 may be configured to independently control the first and second closed loop control circuits to maintain the plate 102 and the shaft 120 at first and second temperatures, respectively. The first and second temperatures may be the same temperature.

Figure 2:
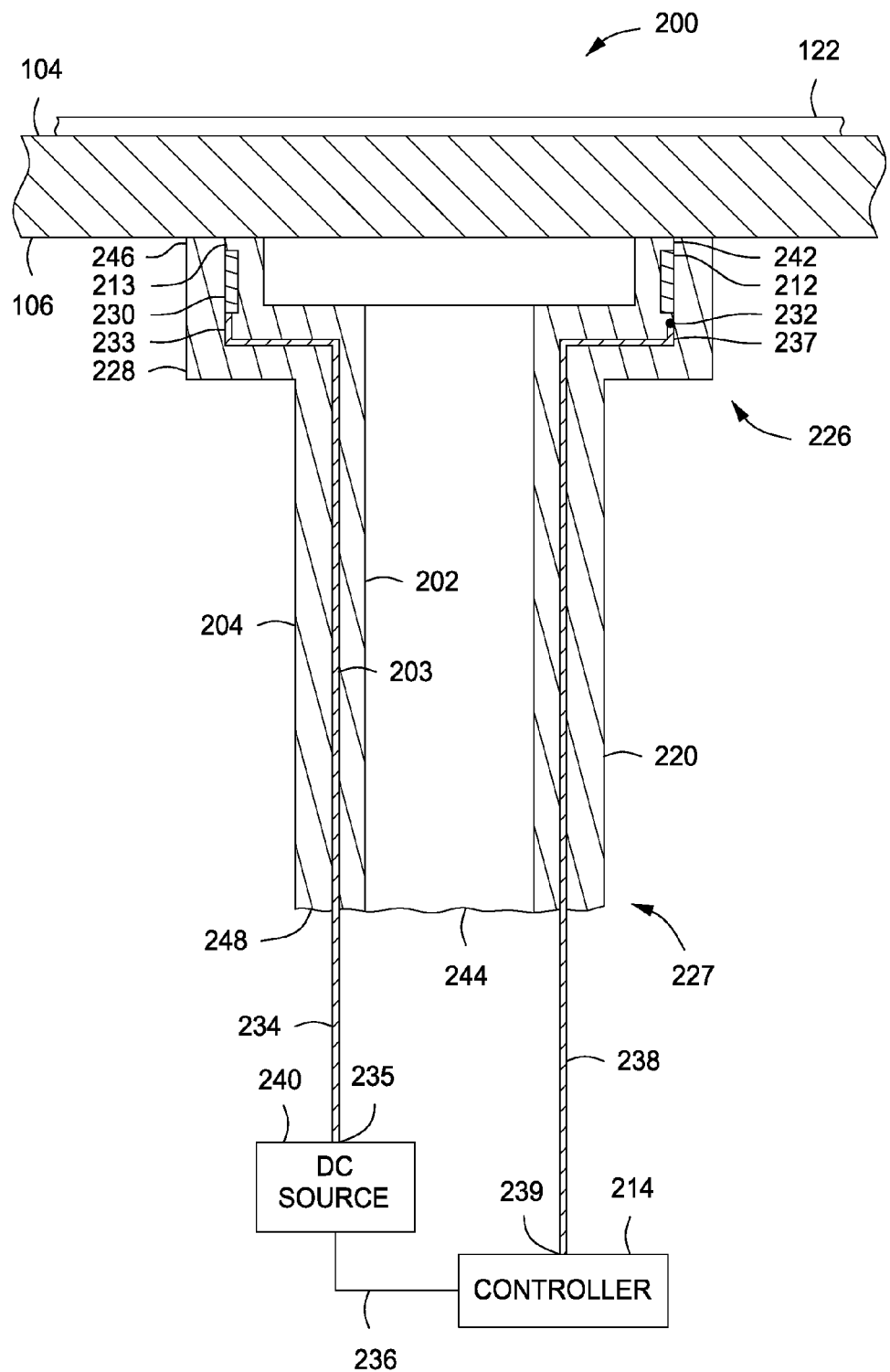
FIG. 2 depicts a schematic side sectional view of a substrate support in accordance with some embodiments of the present invention.

FIG. 2 depicts a simplified schematic side sectional view of a substrate support 200 in accordance with an embodiment of the present invention. The plate 102 may be constructed as described above and is illustrated with some details (for example, the components of the first closed loop circuit described above) omitted for clarity. A ceramic support shaft, shaft 220, is provided to support the plate 102 which rests upon a first end 226 of the shaft 220. In some embodiments, the first end 226 includes a flange 228 adapted to be mounted to the bottom surface 106 of the plate 102 as described above. In some embodiments, the first end 226 may be mounted to the bottom surface 106 of the plate 102 without a flange, as described above.

The shaft 220 as illustrated comprises two layers of ceramic material, a first layer 202 and a second layer 204 (although additional layers may be used). The shaft 220 may be formed from, in non-limiting examples, the ceramic materials discussed above. One or more electrical components may be disposed at the interface 212 between the first layer 202 and the second layer 204.

For example a shaft heater 230 may be disposed in a portion of the flange 228 at the interface 212. Similar to the shaft heater 130 in the embodiment of FIG. 1, a first end 233 of a conductor 234 is coupled to the shaft heater 230. A second end 235 of the conductor 234 extends beyond the second end 227 of the shaft 220 and is coupled to a power source, for example DC source 240, to provide power to the shaft heater 230 and facilitate heating the first end 226 of the shaft 220. The conductor 234 may be completely or partially disposed along the interface 212 between the first layer 202 and the second layer 204.

One or more of the shaft heater 230 and the conductor 234 may be printed on a surface 213 of the first layer 202 or the second layer 204. For example, at least one of the shaft heater 230 and the conductor 234 may be formed by a solution of tungsten, molybdenum, or other metal with a suitable electrical resistivity that is screen printed on a portion of the first layer 202. In some embodiments, the shaft heater 230 and the conductor 234 may be printed on an outer surface 203 of the first layer 202 of ceramic material. For example, the first layer 202 of ceramic material may be formed and the shaft heater 230 and conductor 234 printed on the outer surface 203. A second layer 204 of ceramic material may be formed over the first layer 202 at least partially covering the shaft heater 230 and the conductor 234. The combined first and second layers 202 and 204 may be further processed, for example by sintering, to form a finished shaft 220 with the shaft heater 230 and the conductor 234 disposed at the interface 212.

Prior to further processing, and in a similar fashion, a shaft temperature sensor 232, such as a resistive temperature device (RTD), may also be disposed at the interface 212. The shaft temperature sensor 232 may be printed on the outer surface 203 of the first layer 202. A first end 237 of a conductor 238 may be coupled to the shaft temperature sensor 232. A second end 239 of the conductor 238 extends beyond the second end 227 of the first layer 202 and is coupled to the controller 214. The DC source 240 may also be coupled to the controller 214, for example via conductor 236.

The shaft heater 230, the DC source 240, the shaft temperature sensor 232, and the controller 214 comprise a closed loop circuit similar in construction and function to the second closed loop circuit described above.

In some substrate processes, the temperature profile of the substrate receiving surface predicts the temperature profile of the substrate supported thereon. The temperature non-uniformities across the substrate receiving surface are manifest by non-uniform process performance on the substrate supported thereon. The inventors have observed that in some cases, heat is lost at the central area of the plate, opposite the mounting location of the shaft. The inventors have noted the shaft appears to create a heat sink, removing some of the heat from the plate at the interface of the shaft and the plate. The mounting of the shaft to the plate causes a temperature discontinuity at the substrate mounting surface.

The inventive substrate support may include a heater and temperature sensor at the first end (mounting end) of the shaft to reduce heat loss from the plate. The heater at the first end of the shaft generates additional heat with closed loop control to compensate for heat lost to the shaft. It has been observed that the closed loop control of the shaft heaters advantageously allows accurate control of the temperature of the first end of the shaft. When used in conjunction with the closed loop control of the temperature of the plate, the temperature difference between the plate and the first end of the shaft can be minimized. In cases where the temperature of the first end of the shaft is the same, or substantially the same, as the plate temperature, the inventors have noted an adiabatic interface can be established in which heat neither transfers to nor from the plate. Under such conditions, the inventors have observed no thermal imprint of the shaft on the substrate support surface or on the substrate supported thereon. Accordingly, processing of the substrate can be advantageously effected by maintaining a more uniform temperature across the substrate. In addition, the substrate support may be operated to develop a purposeful non-uniform thermal gradient across the surface of the substrate support (e.g., central region hotter or central region colder) in order to compensate for other sources of heat transfer to or from the substrate during processing (e.g., to maintain a more uniform thermal gradient on the substrate during processing) or to compensate for other sources of processing non-uniformities or non-uniform incoming substrates (e.g., to maintain a purposefully non-uniform thermal gradient on the substrate during processing).

The inventors have also observed that the temperature differential between the heated plate and the unheated shaft in conventional substrate supports can also cause thermal stresses at the interface between the shaft and the bottom of the plate. Thermal stresses can make the attachment between the shaft and the plate problematic, for example as the plate and the shaft expand or contract differently because of the different temperatures.

In the present invention, as discussed above, the shaft heater can advantageously minimize or substantially eliminate the temperature differential between the shaft and the plate at the interface. Accordingly, the thermal stresses and the associated disadvantages can also be minimized or substantially eliminated.

Figure 3:
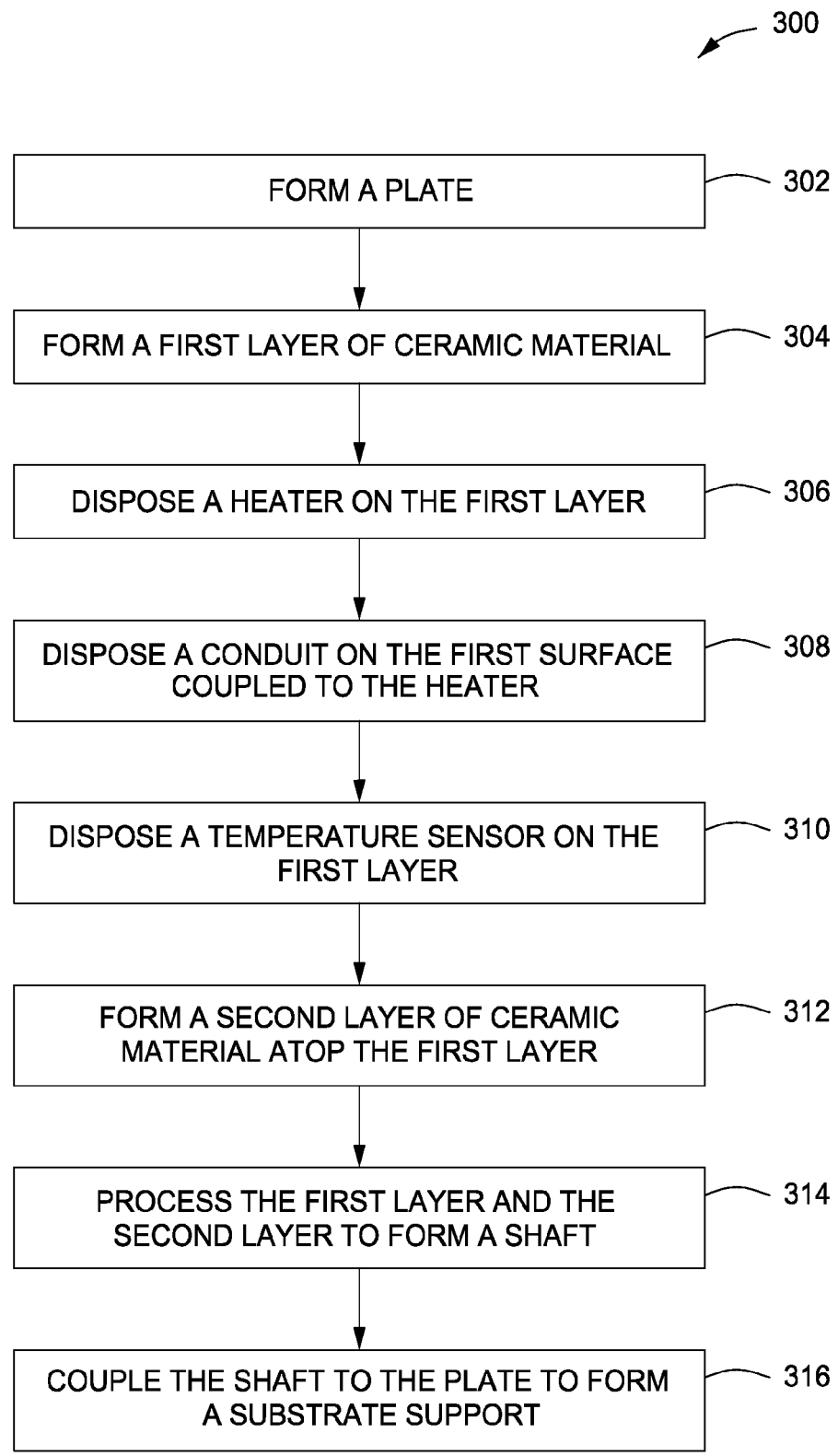
FIG. 3 depicts a flow chart for fabricating a substrate support in accordance with some embodiments of the present invention.

The inventors have developed a novel way of forming the inventive heated substrate support disclosed above. The method is outlined beginning at 300 in FIG. 3, with reference made to the plate 102 (FIG. 1) and the shaft 220 (FIG. 2). At 302, a plate 102 having a substrate receiving surface 104 and an opposite bottom surface 106 is formed. The plate 102 may include one or more plate heaters 108, and a plate temperature sensor 112, such as a resistive temperature device (RTD), embedded in the plate 102. As described above, the plate heaters 108 and the plate temperature sensor 112 may be coupled to the DC source 110 and the controller 114 to form a first closed loop control circuit.

The plate 102 may be formed form ceramic materials as listed above. Forming the plate 102 may include sintering to densify the ceramic materials. Other fabrication processes suitable to the particular material (ceramics or metallic) may be used as appropriate. Forming the plate 102 may occur separately from forming the shaft 220.

At 304, a first layer 202 of ceramic material is formed, the first layer 202 comprising a first end 226 and an opposite second end 227. The first layer 202 may include an area corresponding to the flange 228. In some embodiments, the first layer 202 is formed as a sheet of ceramic material having an upper edge 242 (corresponding to the first end 226 of the shaft, including the flange 228), an opposite bottom edge 244 (corresponding to the second end 227) and lengthwise edges (not shown).

At 306, a shaft heater 230 is disposed on the first layer 202 at the upper edge 242. In some embodiments, the shaft heater 230 is printed on a surface 213 of the first layer 202 using a solution comprising tungsten, molybdenum, or another metal with a suitable electrical resistivity using screen printing techniques as discussed above. The shaft heater 230 may be formed by printing a plurality of layers of the same or different configuration at the upper edge 242.

A conductor 234 may be disposed on a surface 213 of the first layer 202 as at 308. A first end 233 of the conductor 234 may be coupled to the shaft heater 230. A second end 235 extends to the bottom edge 244 of the first layer 202. In some embodiments, the second end 235 extends beyond the bottom edge 244. In some embodiments, the conductor 234 may be printed, for example screen printed, as above using similar materials. An additional conductor (not shown), may be coupled to the conductor 234 at the bottom edge 244 when the conductor 234 is printed on the surface 213, to extend the conductor 234 beyond the bottom edge 244.

Optionally, at 310, the shaft temperature sensor 232, such as a resistive temperature device (RTD), may be disposed on the first layer 202 at the upper edge 242 of the first layer. The shaft temperature sensor 232 may be coupled to a conductor 238 which may be integrally formed with the shaft temperature sensor 232 or separately formed. In some embodiments at least one of the shaft temperature sensor 232 or the conductor 238 may be printed on the surface 213, such as by screen printing.

At 312, a second layer 204 of ceramic material is formed atop the first layer 202 such that the second layer 204 at least partially covers the shaft heater 230. If the conductor 234 is printed on the surface 213, the second layer 204 may at least partially cover the conductor 234. In embodiments in which the first layer 202 is formed as a sheet of ceramic material, the second layer 204 may also be formed as sheet of ceramic material having an upper edge 246 aligned with upper edge 242, an opposite bottom edge 248 aligned with bottom edge 244, and lengthwise edges (not shown).

At 314, the first layer 202 with the heater disposed on surface 213, and with the second layer 204 formed atop the first layer and at least partially covering the heater, are processed together to form a shaft 220. The processing may include a procedure to densify the first and second layers 202, 204 of ceramic materials. For example, the first and second layers 202, 204 may be sintered under elevated temperature and high pressure to form a shaft 220.

In the embodiments in which the first and second layers 202 and 204 are formed sheets of ceramic materials, the sheets may be formed into an open ended tube such that the upper edge 246 is aligned with upper edge 242, and the bottom edge 248 is aligned with bottom edge 244. For example, the first and second layers 202 and 204 may be rolled into a tubular form such that the lengthwise edges of the first layer 202 are joined and the lengthwise edges of the second layer 204 are joined. The tubular form may be a cylinder or other convenient shape.

At 316, the first end 226 of the shaft 220 is coupled to the bottom surface 106 of the plate 102 to form a substrate support in accordance with the present invention. The coupling may be achieved using any suitable mechanical fasteners, such as threaded fasteners or mechanical clamping devices, or adhesives as appropriate.

Thus, embodiments of heated substrate supports having improved temperature uniformity control have been provided. Embodiments of the present invention may be used to support and heat a substrate for any process using a heated substrate support with enhanced control over a temperature profile created on the substrate. Non-limiting examples of processes that may benefit from the discloses substrate support include chemical vapor deposition (CVD), atomic layer deposition (ALD), or laser annealing processes.

While the foregoing is directed to embodiments of the present invention, other and further embodiments of the invention may be devised without departing from the basic scope thereof.

The invention claimed is:

1. A substrate support, comprising:
    a plate having a substrate receiving surface and an opposite bottom surface; and
    a shaft comprising an elongated structure having a first end coupled to the bottom surface of the plate and a second end, wherein a shaft heater is embedded in the first end of the shaft.

2. The substrate support of claim 1, wherein the first end comprises a flange and the shaft heater is disposed within the flange.

3. The substrate support of claim 1, wherein the shaft heater is a resistive heater.

4. The substrate support of claim 3, wherein the shaft heater comprises a conductor embedded in the shaft.

5. The substrate support of claim 4, wherein the conductor is coupled to a power supply to the shaft heater.

6. The substrate support of claim 1, further comprising:
    a power supply coupled to the shaft heater and coupled to a controller; and
    a shaft temperature sensor disposed at the first end and coupled to the controller, wherein the shaft heater, the power supply, the controller, and the shaft temperature sensor are linked in a first closed loop control circuit.

7. The substrate support of claim 6, wherein the plate further comprises:
    a plate heater disposed in the plate;
    a power supply coupled to the plate heater and coupled to the controller; and
    a plate temperature sensor disposed in the plate and coupled to the controller,
    wherein the plate heater, the power supply, the controller, and the plate temperature sensor are linked in a second closed loop control circuit.

8. The substrate support of claim 7, wherein the controller is configured to independently control the first closed loop control circuit and the second closed loop control circuit to maintain the plate and the shaft at a preselected temperature.

9. The substrate support of claim 1, wherein the shaft is formed from a layer of ceramic material.

10. The substrate support of claim 9, wherein the ceramic material comprises one or more of silicon nitride ($Si_3N_4$), alumina ($Al_2O_3$), aluminum nitride (AlN), or silicon carbide (SiC).

11. The substrate support of claim 9, wherein the shaft is formed from two or more layers of ceramic material.

12. The substrate support of claim 9, wherein the shaft heater is disposed on a layer of ceramic material.

13. The substrate support of claim 9, wherein the shaft further comprises a conductor disposed on the layer of ceramic material and coupled to the shaft heater.

14. A substrate support, comprising:
    a plate having a substrate receiving surface and an opposite bottom surface;
    a plate heater disposed in the plate;
    a plate temperature sensor disposed in the plate, wherein the plate heater and the plate temperature sensor are coupled to a controller;
    a shaft comprising an elongated structure having a first end coupled to the bottom surface of the plate and a second end, wherein a shaft heater is embedded in the first end of the shaft; and
    a shaft temperature sensor disposed at the first end wherein the shaft temperature sensor and the shaft heater are coupled to a controller.

15. A method of making a substrate support, comprising:
    forming a plate having a substrate receiving surface and an opposite bottom surface;
    forming a first layer of ceramic material, the first layer comprising a first end and an opposite second end;
    embedding a heater on the first layer at the first end;
    disposing a conduit on the first layer such that one end of the conduit is coupled to the heater and a second end of the conduit extends beyond the second end of the ceramic material;
    forming a second layer of ceramic material atop the first layer such the second layer at least partially covers the heater;
    processing the first layer and the second layer to form a shaft; and
    coupling the first end to the bottom surface of the plate.

16. The method of claim 15, wherein the heater is printed on the first layer of ceramic material.

17. The method of claim 15, further comprising embedding a plate heater in the plate.

18. The method of claim 15, wherein the second layer at least partially covers the conduit.

19. The method of claim 15, wherein the plate is formed from a ceramic material.

\* \* \* \* \*